United States Patent [19]
Macris

[11] Patent Number: 6,025,554
[45] Date of Patent: Feb. 15, 2000

[54] THERMOELECTRIC DEVICE AND METHOD OF MANUFACTURE

[76] Inventor: Chris Macris, 42524 SE. 106th Pl., North Bend, Wash. 98045

[21] Appl. No.: 09/050,617

[22] Filed: Mar. 30, 1998

Related U.S. Application Data

[63] Continuation-in-part of application No. 08/543,447, Oct. 16, 1995, Pat. No. 5,824,947.

[51] Int. Cl.[7] .................................................. H01L 35/30
[52] U.S. Cl. ......................... 136/205; 136/200; 136/201; 136/203
[58] Field of Search ..................................... 136/200, 201, 136/203, 205

[56] References Cited

U.S. PATENT DOCUMENTS

| | | | |
|---|---|---|---|
| 3,248,777 | 5/1966 | Stoll | 136/201 |
| 3,264,714 | 8/1966 | Baer | 136/201 |
| 5,824,947 | 10/1998 | Macris | 136/200 |

*Primary Examiner*—Kathryn Gorgos
*Assistant Examiner*—Thomas H Parsons
*Attorney, Agent, or Firm*—Jensen & Puntigam, P.S.

[57] ABSTRACT

A thermoelectric device comprising at least two dissimilar thermoelements directly bonded to cavities within a heat absorbing interconnection member yielding a strong device.

29 Claims, 12 Drawing Sheets

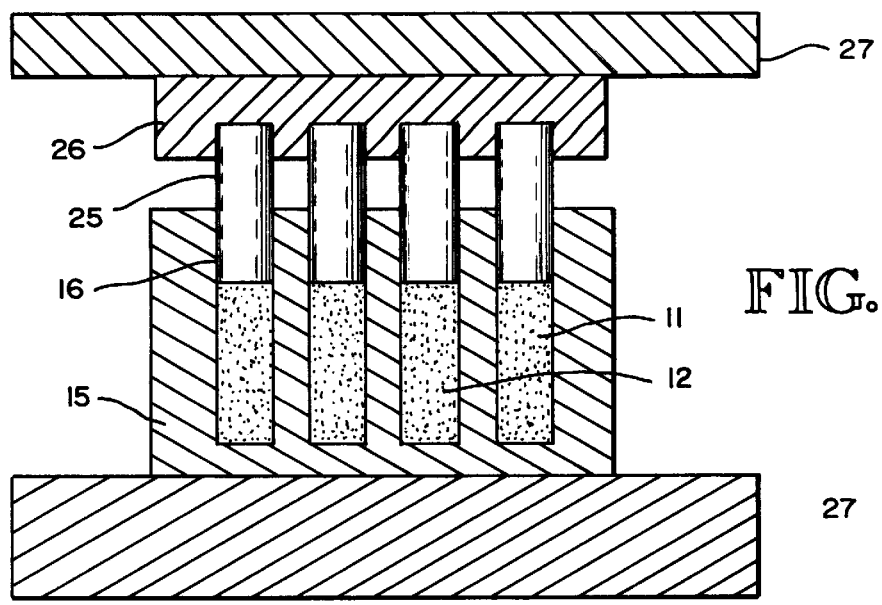
FIG.3D
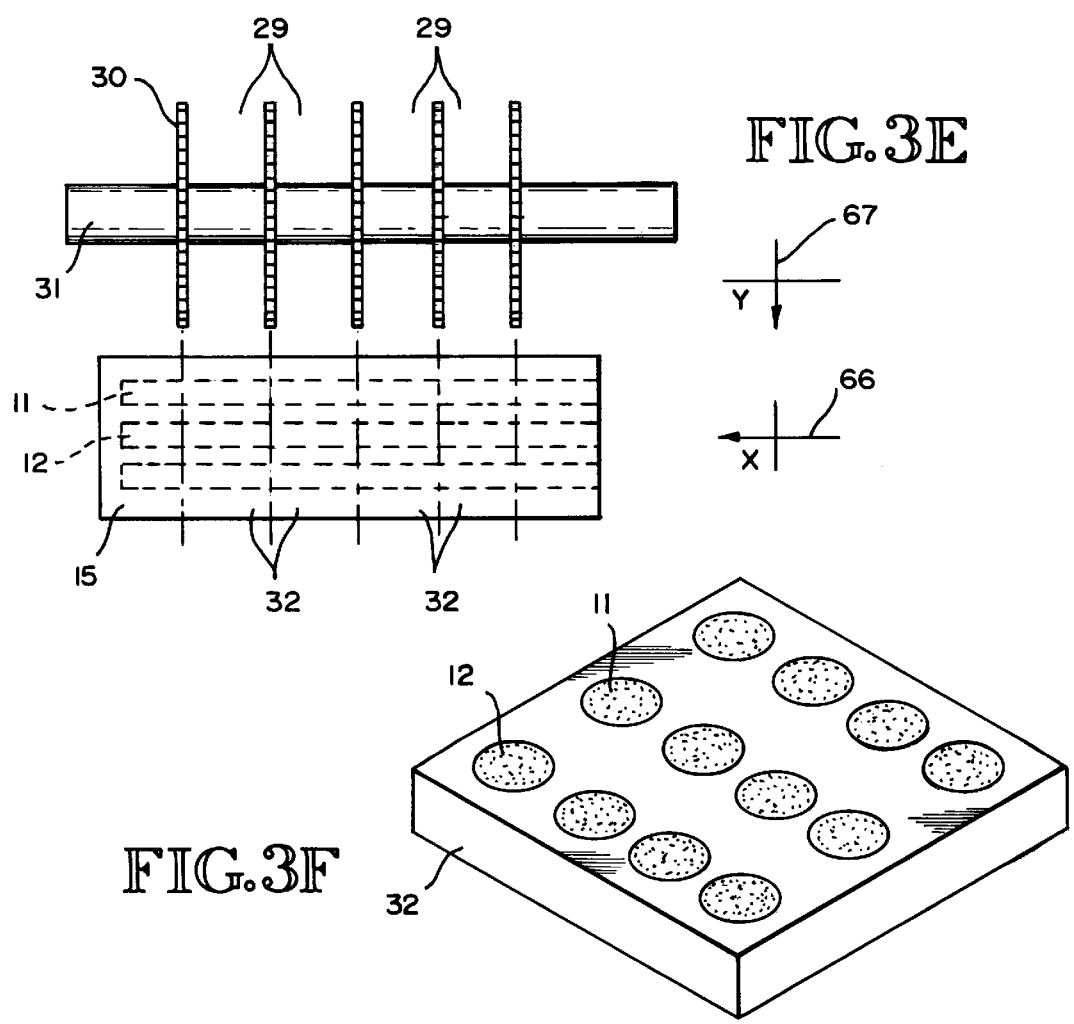
FIG.3E
FIG.3F

THERMOELECTRIC DEVICE AND METHOD OF MANUFACTURE

CROSS-REFERENCE TO RELATED APPLICATION

This application is a continuation-in-part of the application Ser. No. 08/543,447 filed Oct. 16, 1995 (now U.S. Pat. No. 5,824,947).

Technical Field

This invention relates to the field of thermoelectric devices and, more particularly, to a thermoelectric device wherein the device consists of thermoelements and interconnects of unique design which maximize performance while minimizing the use of costly thermoelectric material and further results in a reduction of fabrication steps.

In one embodiment of the present invention, the design and method of manufacture form the foundation for two additional embodiments. The core of this first embodiment consists of a block of metallic material into which several cavities have been formed. This block, termed a "wafer block", becomes a permanent part of the heat absorbing interconnection member in one embodiment by encapsulating each thermoelement contained within it. Another embodiment utilizes the wafer block simply as a support during manufacture and it is later chemically removed to yield a completed device.

After the dispensation of dissimilar type of thermoelements into the cavities, the thermoelements are then hot pressed within the wafer block to achieve bonding to the cavity walls. The wafer block is then sliced to yield more than one "wafer" consisting of thermoelement and wafer block material. The resultant wafer is ready to be integrated into additional design and manufacturing embodiments.

In another embodiment of the present invention, a perforated dielectric substrate is bonded to the newly fabricated wafer to add structural stability to the system.

In still another embodiment of the present invention, the optimal thermelement leg length is obtained by demonstrating a relationship between this leg length and the thermoelement's thermal conductivity value.

BACKGROUND OF THE INVENTION

Thermoelectric devices have been in existence for several decades. These devices utilize dissimilar conductive materials subjected to a temperature gradient across their elemental leg lengths to create an Electromotive Force, or EMF. This EMF, in the form of a voltage, is proportional to the intrinsic thermoelectric power of the thermoelements employed and the temperature differential between their hot and cold junctions. This voltage causes an electric current to flow when the circuit is connected to an external load and thus, electric power is generated. Alternatively, current may be introduced into the thermoelectric circuit to move heat, absorbing it at one junction, moving it and dissipating it at the other junction.

The efficiency of a thermoelectric device can be expressed in terms of a figure of merit (Z) for the materials forming the device, wherein Z is defined as:

Z=S squared divided by p multiplied by K

Where:

Z is expressed in units X1000,

S is the Seebeck Coefficient in microvolts per degree Celsius,

K is the Thermal Conductivity in watt-cm per degree Celsius, is the Electrical Resistivity in ohms-cm From this information, one can see that in order to maximize thermoelectric efficiency, the Seebeck Coefficient (S) must be high and the Thermal Conductivity (K) and Electrical Resistivity (p) must be low in the thermoelectric materials utilized. For applications in the range between 0 Celsius and 200 Celsius, the Bismuth-Tellurium, Bismuth-Selenium, Antimony-Tellurium alloy composition appears to have the highest overall Figure of Merit. Typically, semiconducting compositions, including the alloy mentioned above, have relatively large numerators and fairly large denominators whereas typical metals and their alloys have relatively small numerators and fairly small denominators.

One disadvantage of current thermoelectric devices is the high cost of the semiconducting materials which yield the highest conversion efficiencies available. A reduction in a thermoelement's cross sectional area not only reduces material volume, but increases electrical resistance proportionately. A reduction of element leg length reduces material volume and decreases electrical resistance, but it becomes increasingly difficult to maintain a temperature differential as this leg length is decreased to the point where an impracticable heat exchange mechanism is required to remove the heat faster than it is entering the thermoelectric device. This is due to the thermal conduction characteristics of the thermoelement material. Secondly, as leg lengths are further reduced, fabrication of the thermoelements themselves becomes increasingly difficult due to the semiconductor's fragile nature.

U.S. Pat. No. 5,434,744, granted to Fritz on Jul. 18, 1995 discloses a substrated thermoelectric device in which thermoelemental spacing is less than 0.010 inch and thermoelemental thickness is less than 0.050 inch. In addition, an improved device is claimed to have greater than 300 thermoelements and their said thickness is "approximately" 0.020 inch.

The design of the present invention allows for a further reduction in thermoelemental thickness while still maintaining optimum performance.

U.S. Pat. No. 5,108,515, granted to Ohta on Apr. 28, 1992 discloses a Bi,Te,Se,Sb thermoelemental material which is pulverized to a specific particle size and then forming a green molding which is then sintered.

U.S. Pat. No. 5,246,504, also granted to Ohta on Sep. 21, 1993 is nearly identical in what is claimed to U.S. Pat. No. 5,108,515.

U.S. Pat. No. 5,108,788 and U.S. Pat. No. 5,108,789, both granted to Rauch, Sr. on Jan. 5, 1988 discloses a PbTe thermolemental material in which the compound is: melted, chill cast into an ingot, ground to a particle size of less than 60 mesh, cold pressed to 30–70 kpsi, and finally sintered the resultant green body.

U.S. Pat. No. 3,400,452, granted to Emley on Sep. 10, 1968 discloses using hot isostatic pressure (even, compressive pressure in all directions) to provide metallurgical bonding between the thermoelemental material and the walls of a metal tube in which it is housed.

U.S. Pat. No. 3,601,887, granted to Mitchell on Aug. 31, 1971 also discloses the use of hot isostatic pressure to provide bonding between the inner walls of a tube and the thermoelectric material.

U.S. Pat. No. 5,318,743, granted to Tokiai on Jun. 7, 1994 discloses to "presinter" a Bi,Te,Se,Sb thermoelemental material, then mold the presintered powder and sinter the resultant form also using hot isostatic pressing technology. The actual thermoelements are then cut from the sintered bulk.

U.S. Pat. No. 5,103,286, granted to Ohta on Apr. 7, 1992 discloses a simultaneous sintering and bonding of the thermoelements to themselves and to their respective interconnection members with the absence of pressure to create any of the bonding. Sintering, which is the heating of an aggregate of metal particles in order to create agglomeration does not involve simultaneous pressure.

U.S. Pat. No. 3,554,815, granted to Osborn on Jan. 12, 1971 discloses a device consisting of a thin, flexible substrate in which "bands" of dissimilar thermoelectric material are disposed on opposite sides of the substrate and perforations within the substrate contain a metallic filler to electrically connect each thermoelement.

U.S. Pat. No. 4,343,960, granted to Eguchi on Aug. 10, 1982 discloses a device consisting of a perforated dielectric substrate in which each dissimilar thermoelement is plated, in a pattern, to portions of both faces and to the walls of each thru-hole.

U.S. Pat. No. 4,459,428, granted to Chou on Jul. 10, 1984 discloses a "substrateless" in which each dissimilar thermoelement junction is soldered to conductive plates and an electrical series pattern is created by etching away portions of the conductive plates.

U.S. Pat. No. 3,201,504, granted to Stevens on Aug. 17, 1965 discloses a method of molding a thermoelectric couple in which dielectric sleeve members are inserted into a mold containing a conductive bottom member, powdered dissimilar thermoelectric material is added into their respective sleeves, powdered conductor is placed on top of both thermoelements, and pressing and subsequent sintering of the entire assembly yields a solid thermocouple.

U.S. Pat. No. 3,129,117, granted to Harding on Apr. 14, 1964 discloses a method of manufacturing a thermoelectric element utilizing hot pressing in a direction perpendicular to current flow through the thermoelement.

U.S. Pat. No. 3,182,391, granted to Charland on May 11, 1965 dislcoses a process for forming, in one step, a thermoelement with a metallic electrical contact at one end which comprises consolidating the thermoelectric material and metallic contact plate within a die cavity which is then hot pressed and removed from the mold cavity.

Although many prior art documents list hot/cold pressing, isostatic pressing and sintering of thermoelement materials, cast in separate molds, to yield whole thermoelements for the later assembly of complete devices, the present invention is unique in that thermoelement material is hot pressed directly onto their respective interconnection members. This "process in place" concept eliminates separate mold steps in addition to creating excellent bonding between the thermoelement and it's interconnection member.

Lastly, for the thermoelectric device to see larger scale deployment, it must become competitive with the conventional alternatives. Therefore, to be competitive, it is necessary that the overall device fabrication costs be kept to a minimum. Current fabrication costs are high partly due to the device's own design. A more manufacturable friendly design can reduce the amount of processing steps currently required and possibly reduce material requirements resulting in overall size, weight, and cost reductions. In addition, new and more novel methods for the manufacture of the actual thermoelement material and the subsequent fabrication of the thermoelements need to be developed to further reduce costs.

DISCLOSURE OF THE INVENTION

Accordingly, it is the overall object of the present invention to provide a thermoelectric device which minimizes the device fabrication costs through the simplification of the fabrication process and reduction of materials. The overall object will be achieved by first creating wafers composed of thermoelement material and a wafer block which will then form the foundation for two main thermoelectric device design embodiments and their respective fabrication methods.

It is another object of the present invention to demonstrate a relationship between the minimum thermoelement leg length possible and the material's thermal conductivity value when an optimum heat dissipating interconnect (such as the configuration presented in the present invention) is employed. This results in a drastic reduction in the volume of expensive thermoelement material required. When an optimum heat dissipating interconnect is bonded to the heat rejecting face of the thermoelement, a correlation exists between the thermoelement's thermal conductivity value and the optimum thermoelement leg length. Any increase in element leg length above this optimum would result in thermoelemental material waste. When any type of thermoelement material is incorporated into the design of the present invention, the optimum thermoelement leg length, in centimeters, is equal to the value of the particular thermoelement's thermal conductivity value, given in watts/ centimeter per degree Celsius, with a leg length tolerance of plus 0.025 centimeters or minus 0.010 centimeters. For example, a Bismuth-Tellurium alloy thermoelemental material whose thermal conductivity value is 0.015 watts/ centimeter per degree Celsius has been found to possess an optimum thermoelement leg length between 0.005 centimeters and 0.040 centimeters. Other thermoelement materials were tested and all yielded the same value correlation with similar tolerances.

An additional object of the present invention is to provide a thermoelectric device fabrication method in which one face of a block of conductive material (termed a wafer block) contains several cavities. Dissimilar thermoelectric material is disposed and hot pressed in the cavities to yield diffusion bonding of the thermoelements to the walls of these wafer block cavities.

Yet another object of the present invention is to provide a hot pressed thermoelement fabrication technique. The thermoelements, in powder or granular form, are hot pressed into their positions within the cavities of the wafer block using uniaxial compaction pressures and heat. This creates direct diffusion bonding between each individual thermoelement particle and also to the walls of the wafer block cavities in one step. Uniaxial pressure is simply the application of pressure along one axis or line from either one direction or opposing directions along the same line. The resulting thermoelement to wafer block cavity bond is a metallurgical bonding of the highest electrical, thermal and structural quality. Simultaneously pressing and heating these thermoelement materials yields the morphology (desired crystalline structure) necessary to optimize the performance potential of the materials utilized.

In another embodiment of the present fabrication technique, the thermoelements are melted and/or grown from a granular or powder stock into their permanent positions within the wafer block cavities. This utilizes a temperature zone technique in order to properly orient the growing crystal. When properly grown, each crystalline thermoelement will possess the necessary morphology as well as being metallurgically bonded to the wafer block cavity walls. Although this technique reduces the amount of thermoelement processing steps, it is more intolerant of various process parameters such as impurities, growing speeds and temperatures. With careful control, this embodiment is a competitive alternative to the hot press thermoelement processing technique described above.

Yet, another object of the present invention is to provide a novel method for the dispensation of thermoelectric material into more than one wafer block cavity simultaneously.

Another object of the present invention is to provide a novel method of obtaining uniform hot pressing pressures on multiple thermoelements simultaneously. These thermoelements are contained within the wafer block cavities.

Again, another object of the present invention is to provide a thermoelectric device fabrication method in which the wafer block is sliced in a direction perpendicular to the depth of the cavities to yield individual wafers.

Yet again, an object of the present invention is to provide a thermoelectric device fabrication method in which the heat absorbing and heat rejecting interconnection members are created by the method of electroplating.

Still another object of the present invention is to provide a thermoelectric device fabrication method in which the heat absorbing and heat rejecting interconnection members are created and bonded via electroplating directly onto each junction of the thermoelements and onto the wafer block.

Another object of the present invention is to provide a thermoelectric device fabrication method in which the wafer block material is chemically removed from each wafer. This yields a resultant device consisting of thermoelements and their respective heat absorbing and heat rejecting interconnection members.

Yet, another object of the present invention is to attach an adhesive tape carrier to the interconnection members in order to provide structural stability for each completed thermoelectric device.

In yet another object of the present invention, a perforated dielectric substrate is mounted to one face of each wafer. This provides structural stability for the wafers and for the heat rejecting interconnection members which bond to each of the heat rejecting faces of the thermoelements through these perforations.

Lastly, another object of the present invention is to combine all these unique design aspects and individual fabrication techniques into an overall method of thermoelectric device manufacture which will yield a device of superior value.

BRIEF DESCRIPTION OF THE DRAWINGS

FIGS. 3a through 3f demonstrate the process flow for the fabrication of the thermoelectric wafer.

FIGS. 5a through 5i demonstrate the process flow for the fabrication of another embodiment of the present invention.

BEST MODE FOR CARRVINA OUT THE INVENTION

Figure 1:
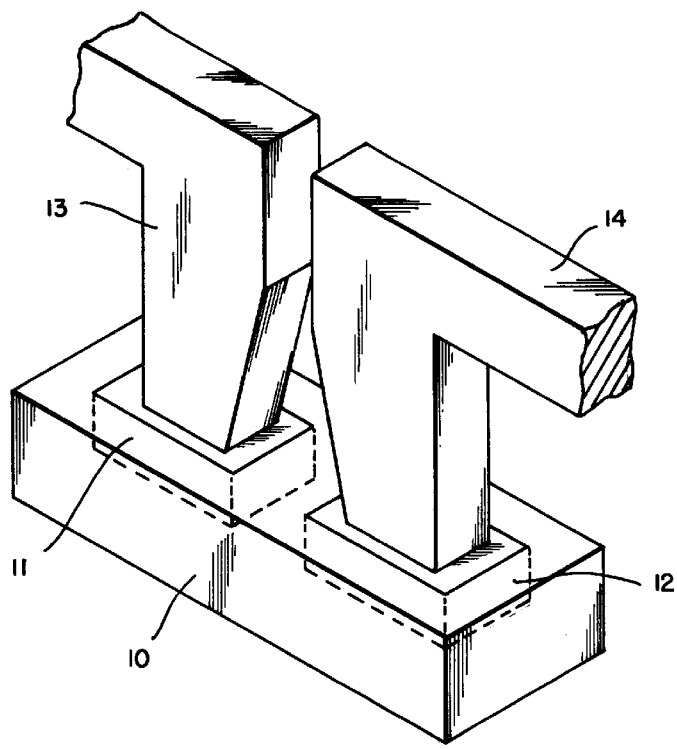
FIG. 1 is a pictorial representation illustrating the encapsulation of each thermoelement on all faces with the exception of the heat rejecting face by the heat absorbing interconnection member comprised of wafer block material.

As seen in FIG. 1, the thermoelectric couple includes a complete heat absorbing interconnection member 10 having embedded therein a positive-type conductivity thermoelement 11 and a negative-type conductivity thermoelement 12. Upwardly extending from the positive thermoelement 11 is a heat rejecting interconnection member 13 and extending from the negative thermoelement 12 is also a heat rejecting interconnection member 14. This view clearly illustrates how the heat absorbing interconnect 10 partially encapsulates each thermoelement 11 and 12 on all of their faces with the exception of the face on which the heat rejecting interconnection members 13 and 14 are attached.

To effectively absorb and dissipate heat in addition to providing high electrical conductivity to the device, these interconnects should be of a highly electrical and thermally conductive material such as copper, aluminum, or their respective alloys. Optimally speaking, the thermoelement material, composed of a Bismuth-Tellurium, Bismuth-Selenium, Antimony-Tellurium alloy composition, is properly doped to yield both positive and negative conductivity type thermoelements.

Figure 2:
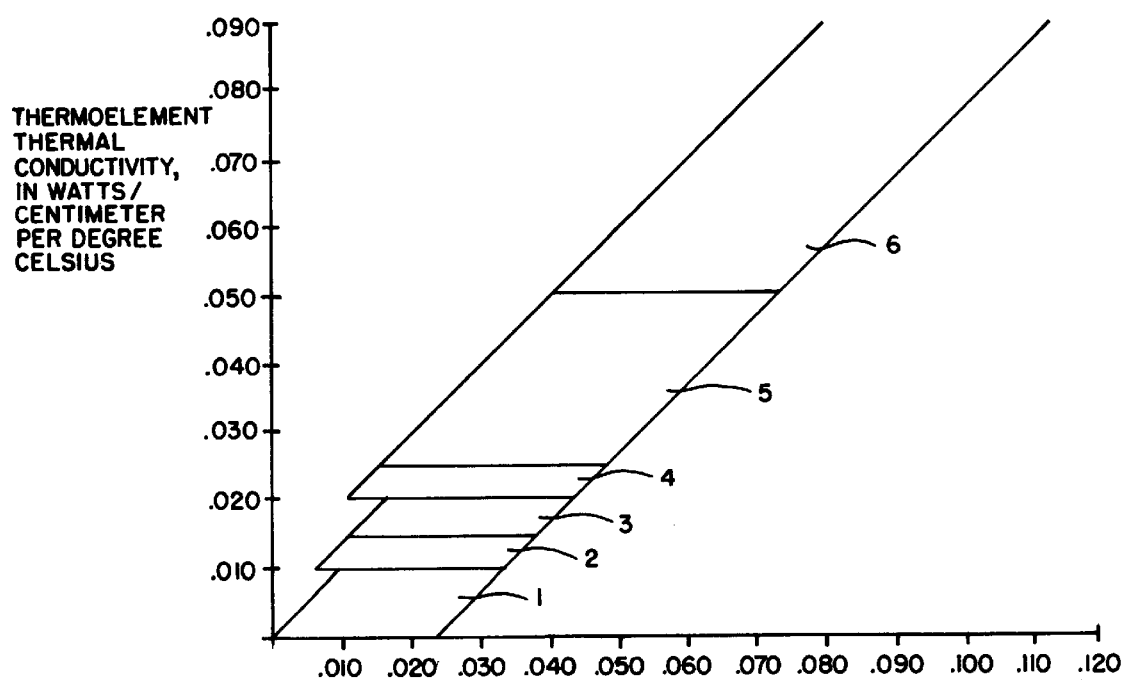
FIG. 2 is a graph illustrating the empirically derived relationship between a thermoelement's Thermal Conductivity and it's optimum, or minimum, thermoelement leg length.

FIG. 2 is a graphical illustration depicting the empirically derived relationship between any thermoelement's leg length and it's particular thermal conductivity value. When this value is given in watts/centimeter per degree Celsius, for any thermoelectric material the optimum thermoelement leg length is equal to that particular thermal conductivity value with a leg length tolerance.

The first graphical range 1 illustrates a thermoelement whose thermal conductivity value is less than 0.01 watts/centimeters per degree Celsius, has a leg length, in centimeters, equal to the particular thermoelement's thermal conductivity value, given in watts/centimeters per degree Celsius, with a leg length tolerance of plus 0.025 centimeters.

The second graphical range 2 illustrates a thermoelement whose thermal conductivity value is between 0.01 and less than 0.015 watts/centimeters per degree Celsius, has a leg length, in centimeters, equal to the particular thermoelement's thermal conductivity value, given in watts/centimeters per degree Celsius, with a leg length tolerance of plus 0.025 centimeters or minus 0.005 centimeters.

The third graphical range 3 illustrates a thermoelement whose thermal conductivity value is between 0.015 and less than 0.020 watts/centimeters per degree Celsius, has a leg length, in centimeters, equal to the particular thermoelement's thermal conductivity value, given in watts/centimeters per degree Celsius, with a leg length tolerance of plus 0.025 centimeters or minus 0.005 centimeters.

The fourth graphical range 4 illustrates a thermoelement whose thermal conductivity value is between 0.020 and less than 0.025 watts/centimeters per degree Celsius, has a leg length, in centimeters, equal to the particular thermoelement's thermal conductivity value, given in watts/centimeters per degree Celsius, with a leg length tolerance of plus 0.025 centimeters or minus 0.010 centimeters.

The fifth graphical range 5 illustrates a thermoelement whose thermal conductivity value is between 0.025 and less than 0.050 atts/centimeters per degree Celsius, has a leg length, in centimeters, equal to the particular thermoelement's thermal conductivity value, given in watts/centimeters per degree Celsius, with a leg length tolerance of plus 0.025 centimeters or minus 0.010 centimeters.

The sixth graphical range 6 illustrates a thermoelement whose thermal conductivity value is equal to or greater than 0.050 watts/centimeters per degree Celsius, has a leg length, in centimeters, equal to the particular thermoelement's thermal conductivity value, given in watts/centimeters per degree Celsius, with a leg length tolerance of plus 0.025 centimeters or minus 0.010 centimeters.

All materials possess a thermal conductivity value which is a function of the ability of the material to transfer heat through itself via thermal conduction. The value each material possesses is derived using a standard unit of measurement. One standard of many is the metric based measurement of Watts/Centimeter per degree Celsius. When employing this standard, the test material is a one cubic centimeter square. The sample is subjected to a known temperature differential and the quantity of heat, in watts, is measured as it flows through the sample. The final value corresponds to the quantity of heat flowing through a material measuring one cubic centimeter square with temperature differential across the square of one degree Celsius.

Now, in a thermoelectric device it is desirable to provide a maximum temperature differential across the unit in order to maximize efficiency which is accomplished by removing more heat from the heat rejecting face of the device than the quantity of heat absorbed from the opposite face. It is clear that the quantity of heat absorbed and, thus, heat transferred through the device is a function of the thermoelement's thermal conductivity. This heat flow, or quantity, is increased by the decrease in thermoelement leg length as the formula shows. So, for a given heat removing capacity of a heat rejecting interconnection member in a thermoelectric device, there exists an optimal thermoelement leg length; optimal because a further reduction in leg length reduces the possible temperature differential and, thus, the efficiency. If the leg length increases, negligible increases in the temperature are obtained with a small gain in efficiency.

FIGS. 3a through 3f, demonstrate the process flow for the fabrication of the thermoelectric wafer, forming the core of two embodiments of the present invention illustrated in FIGS. 4a through 4g and 5a through 5i.

Figure 3A:
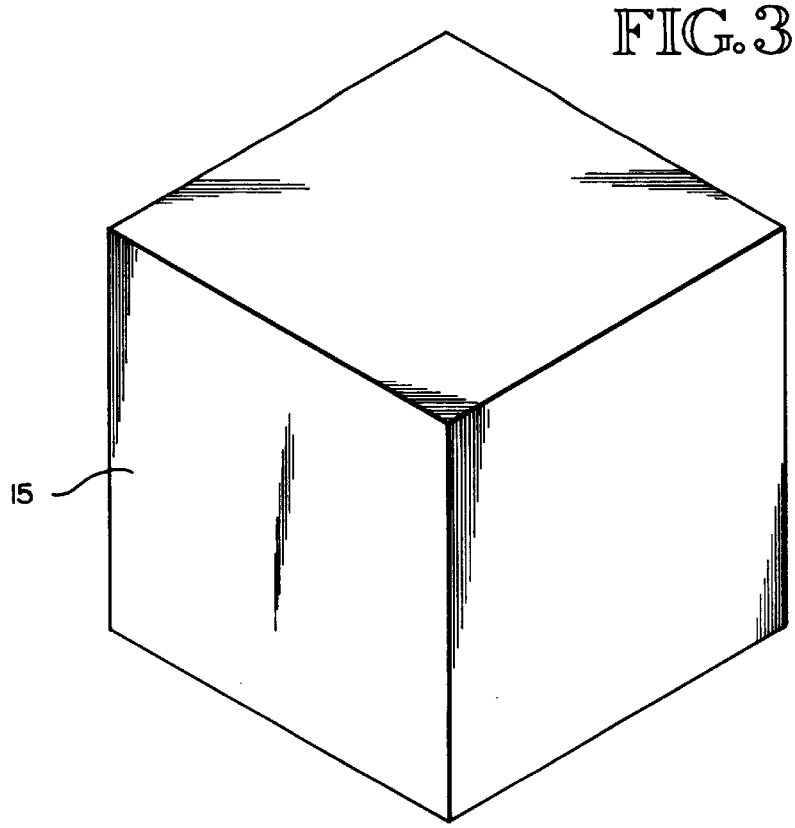

As shown in FIG. 3a, the wafer block 15 is shown as a block of material, preferably a steel.

Figure 3B:
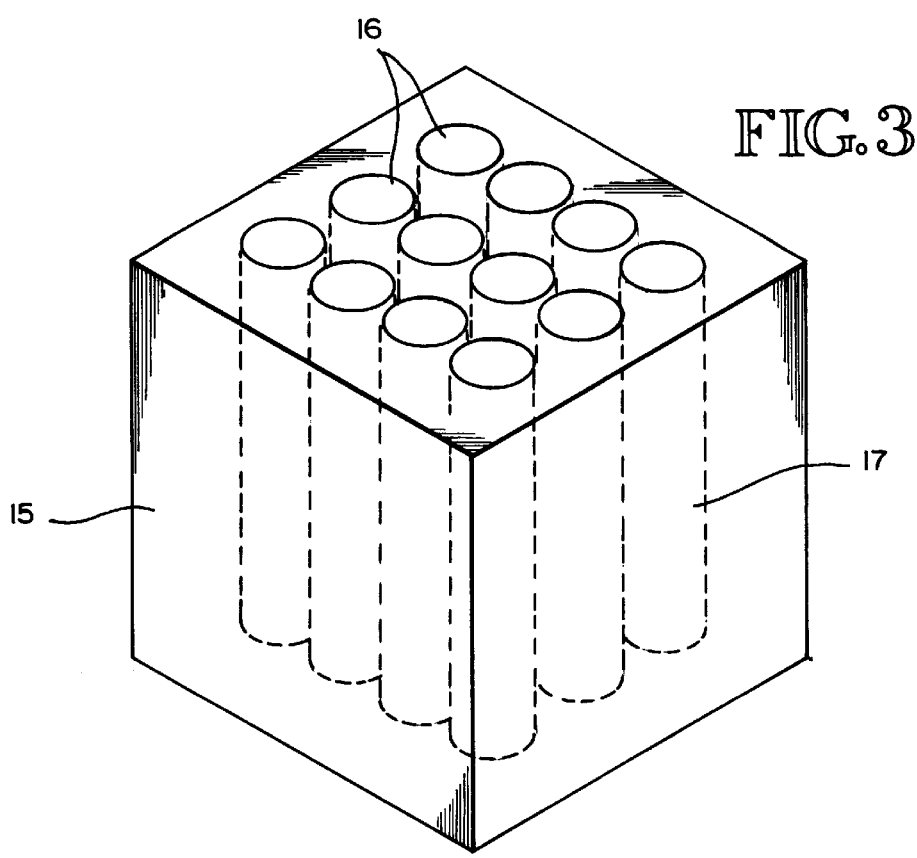

As seen in FIG. 3b, the wafer block 15 contains two or more cavities 16. These cavities 16, typically formed by mechanical drills, will house the two types of thermoelements 11 and 12 depicted in FIGS. 1 and 2.

Once dispensed into their respective cavities 16, the thermoelements 11 and 12 will be subjected to compressing pressure from each of the cavity openings, in a uniaxial direction, with individual hot press pins along with the simultaneous application of heat. This process, termed "Hot Pressing", causes thermoelement densification and creates diffusion bonding of each thermoelement 11 and 12 to the walls 17 of the wafer block cavities 17.

Figure 3C:
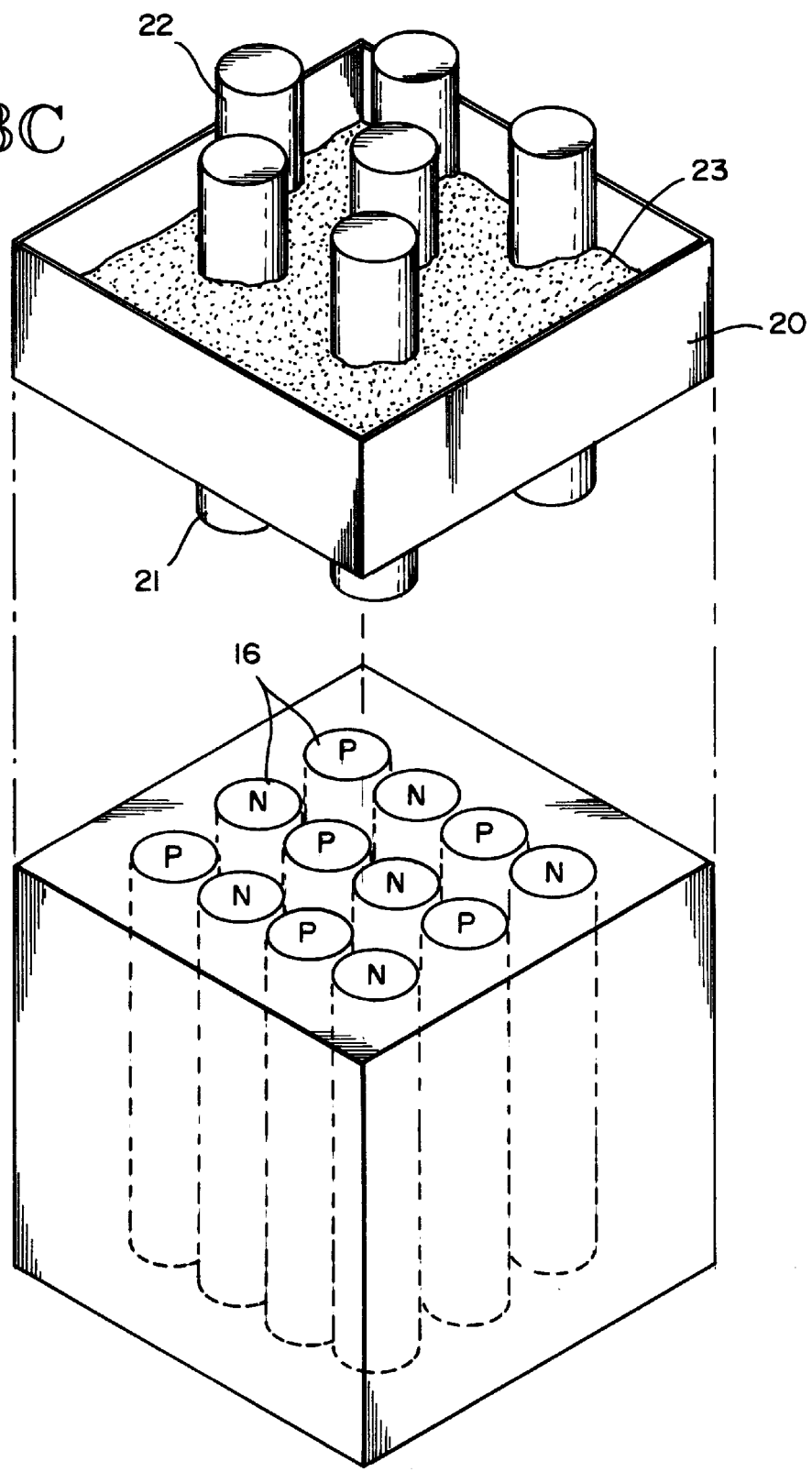

Reference is now made to FIG. 3c wherein an apparatus is illustrated for the simultaneous dispensation of thermoelement material into multiple cavities. These cavities 16, in the wafer block 15, require dispensation of two types of thermoelement material 11, 12 (depicted in FIGS. 1 and 2) in the appropriate cavities 16. A dispensation reservoir 20, containing powdered or granulated thermoelement material 23 is positioned over the wafer block 15 to be filled. Outlet ports 21 on the dispensation reservoir 20 are aligned with the cavities 16 of one thermoelement type. Reservoir plungers 22, with an external diameter slightly smaller than the internal diameter of the outlet ports 21, act as "caps" when positioned within the outlet ports 21, thus, prohibiting the flow of thermoelement material 23 until the dispensation reservoir 20 is in position.

Upon commencement of dispensation, the dispensation reservoir 20 is vibrated slightly and each reservoir plunger 22 begins a reciprocating movement up and down in order to force the thermoelement material 23 into each cavity 16. After one type of thermoelement material 11 has been dispensed, the second type 12 will also be deposited with an identical dispensation reservoir apparatus 20 with the outlet port 21 locations corresponding to the second thermoelement type cavity locations. Since the two types of thermoelement materials 11 and 12 are configured in an alternating fashion within the wafer block 15, each outlet port 21 on each dispensation reservoir 20 also alternates in a pattern corresponding to every other cavity 16 within the wafer block 15.

FIG. 3d discloses a method of obtaining uniform, uniaxial compressive forces on multiple hot press pins, each interfacing two types of thermoelement material 11 and 12 of varying heights due to possible irregularities in dispensation. Upon completion of the dispensation of thermoelement material seen in FIG. 3c, the powdered thermoelement material 11 and 12 must be hot pressed by applying simultaneous heat and pressure. Both types of thermoelement material 11 and 12 will be subjected to the same compressive forces during the hot press procedure.

High strength, hardened hot press pins 25 are placed partially within each cavity 16 in order to apply compressive pressure to the thermoelement material 11 and 12. A "crush plate" 26 is placed atop the array of hot press pins 25 and the entire assembly is loaded between two platens 27 of a hydraulic press. This crush plate is of a metallic material whose yield strength is slightly less than the force exerted onto the thermoelectric material and less than the yield strength of the hot press pins. The crush plate 26 will transfer uniform pressure to all hot press pins 25 from the hydraulic press platen 27. Once the pressure exerted by the press exceeds the yield strength of the crush plate 26, each individual hot press pin 25 will partially embed itself into the crush plate 26 in accordance with the amount of thermoelement material present in each cavity. The cavities 16 which have been filled higher than the others will have more of the hot press pins 25 protruding from these cavities 16. Therefore, this will cause their hot press pins 25 to be the first and the furthest to partially embed into the crush plate 26. The wafer block 15 now contains thermoelements 11 and 12 which have been hot pressed in place with a uniaxial pressure.

FIG. 3e depicts an apparatus composed of circular saws 30 that are spaced apart on an arbor 31 for slicing through the wafer block 15 in various locations to yield discrete wafers 32 (as seen in FIG. 3f). The spacing 29, between each saw, corresponds to the optimum leg length of the thermoelements 11 and 12 as seen in FIG. 2. The saws 30 cut completely through the wafer block 15 in a direction (noted as the y-axis 67) perpendicular to the direction of cavity depth noted as the x-axis 66. The sawing operation yields individual wafers composed of thermoelements 11 and 12 and wafer block 15 with an overall wafer thickness corresponding to the optimum leg length.

Lastly, FIG. 3f displays the final form of the process flow, described by FIGS. 3a through 3e, as the completed thermoelectric wafer 32.

FIG. 3d outlines a procedure for simultaneously bonding particles of thermoelement material to itself and to the walls of the wafer block cavities through use of heat and pressure. Another embodiment of manufacturing the present invention involves the melting and recrystallization of the same powdered thermoelement material within these wafer block cavities. With a relatively oxide-free cavity surface, excellent cavity wall adhesion is attained. The resultant bulk thermoelemental structure is a polycrystalline structure with a fairly random crystal orientation which is similar to the structure obtained through typical powder metallurgical processes. With the proper control mechanisms, this thermoelement "grown in place" technique yields a highly dense and efficient bulk thermoelement and simultaneously creates excellent bonding to the wafer block. An additional benefit of this technique is the reduction in device fabrication cost through the elimination of processing steps requiring time and equipment.

FIGS. 4a through 4g illustrate one example of the process for producing a thermoelectric device according to the present invention. Additionally, the process flow illustrated in FIGS. 4a through 4g is a continuation of the process flow as seen in FIGS. 3a through 3f utilizing the afer 32 as seen in FIG. 3f.

Figure 4A:
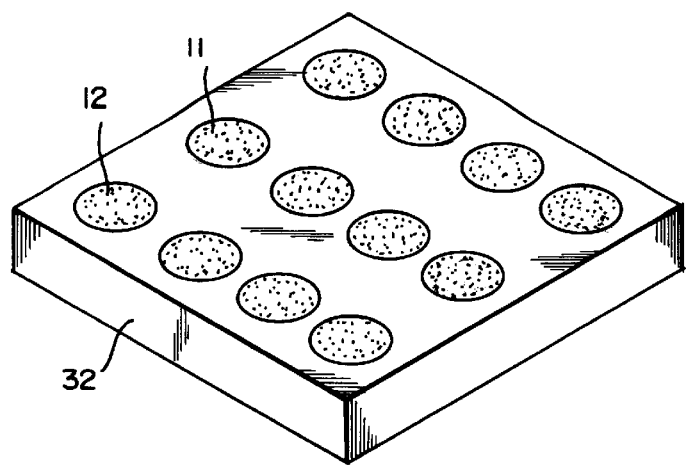
FIGS. 4a through 4g demonstrate the process flow for the fabrication of one embodiment of the present invention utilizing a perforated dielectric substrate.

FIG. 4a depicts the wafer 32 containing thermoelements 11 and 12 originally seen in FIG. 3f.

Figure 4B:
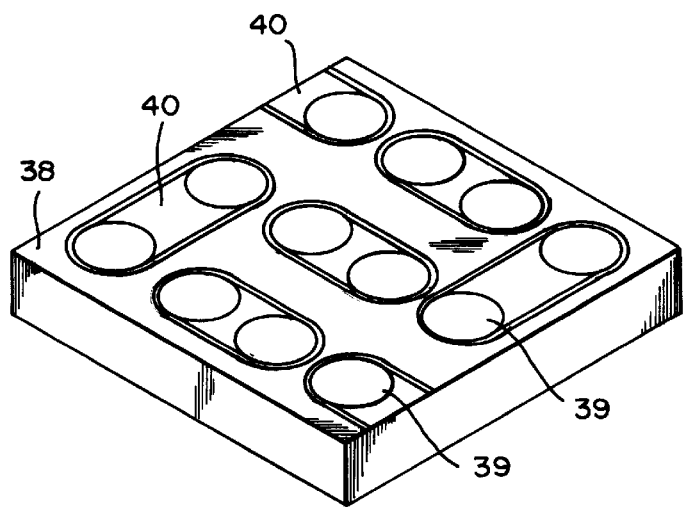

FIG. 4b introduces a 15 to 20 mil thick perforated, dielectric substrate 38 which contains a pre-defined conductive pattern 40, bonded to one face of the substrate 38. This conductive pattern 40, beginning as a single 1 mil thick metallic layer, was patterned using mask printing and chemical etching techniques identical to those utilized for the fabrication of printed circuit boards. Additionally, the perforation walls 39 have been presensitized, sensitized or rendered conductive, through the use of other common printed circuit board techniques. The conductive perforations 39 will enable electroplated layers to bond to these walls. The placement of the perforations 39 within the substrate 38 corresponds to the location of each thermoelement 11 and 12 within the wafer 32.

Figure 4C:
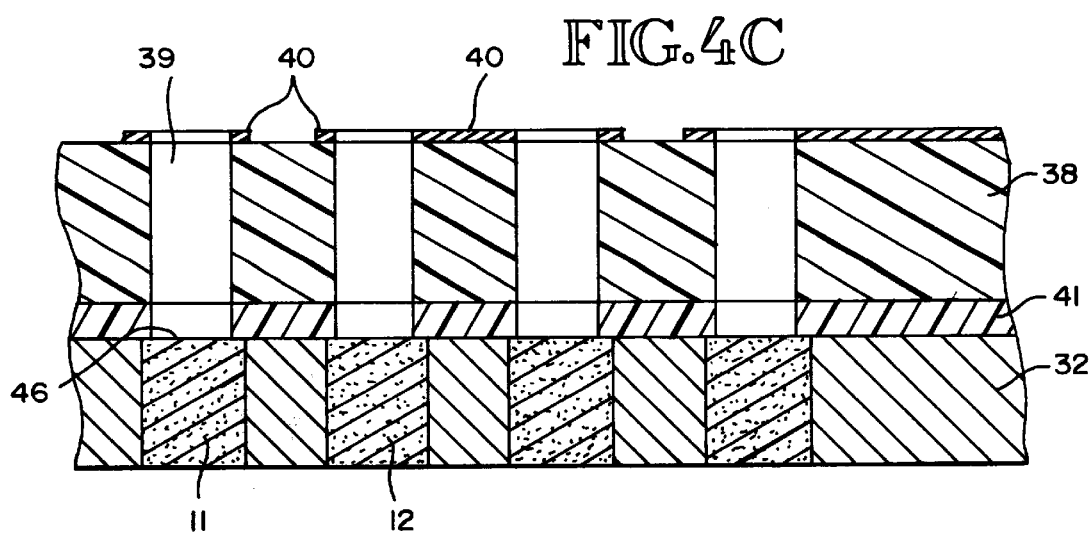

Within FIG. 4c, it can be seen that the substrates' perforations 39 are aligned with each corresponding thermoelement 11 and 12 and then the entire substrate 38 is bonded to the heat rejecting face 46 of the wafer 32 with either a tape-based adhesive or an epoxy 41. Additionally, the perforations' 39 diameters are slightly smaller than the diameters of the corresponding thermoelements 11 and 12.

Figure 4D:
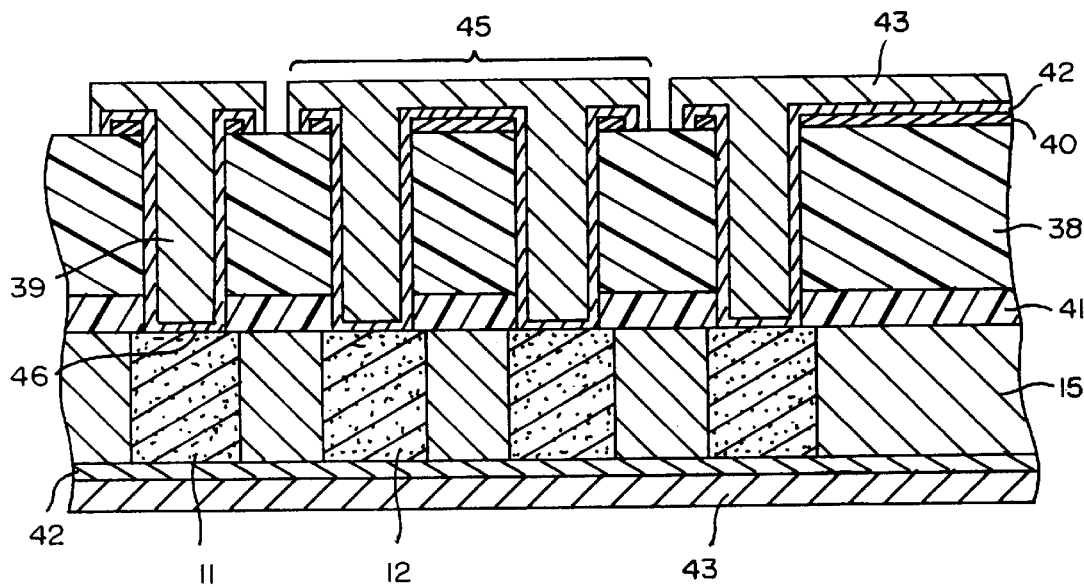

FIG. 4d illustrates the heat rejecting interconnection members 45 which have been bonded to the heat rejecting faces 46 of each thermoelement 11 and 12.

Electroplating, employed to create these heat rejecting interconnection members 46 and their connections to the thermoelements 11 and 12, builds plated layers on the heat rejecting face 46 of each thermoelement 11 and 12. These plated layers consist of a Nickel layer 42, which directly interfaces each thermoelement heat rejecting face 46 and Copper 43 which builds upon the Nickel layer 42. Masked by the substrate perforations 39, the plated layer continues to build up from each thermoelement's heat rejecting face 46. Also, the plated layer will build along the pre-sensitized walls of the perforations 39 and plate onto the metallic layer 40 (pre-defined conductive pattern) seen in FIG. 4b. Preferably, the plated layer will continue to build up within the perforations 39 until completely filled with plated metal.

Additionally, FIG. 4d illustrates metallic layers 42, 43 plated to the wafer face opposite the face on which the perforated substrate 38 is bonded. These plated layers 42, 43 are an extension of the wafer block material 15 and will later become part of the heat absorbing interconnection members. Another embodiment of the present invention utilizes a molten or semi-molten metallic spraying process, such as plasma or flame spraying, to create the heat absorbing and heat rejecting interconnection members in lieu of electroplating.

Figure 4E:
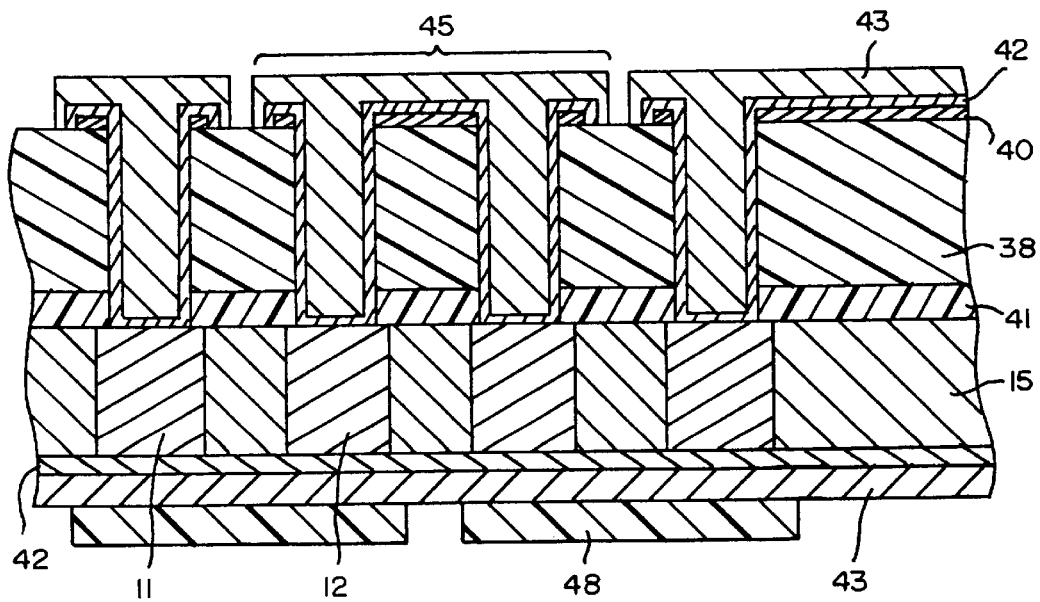

Within FIG. 4e, a chemical etch mask 48 has been applied to the Copper layer 43 (on the face opposite to which the substrate is bonded) in order to protect certain regions of the plated layers 42, 43 and wafer block material 15 from chemical etchant attack.

Figure 4F:
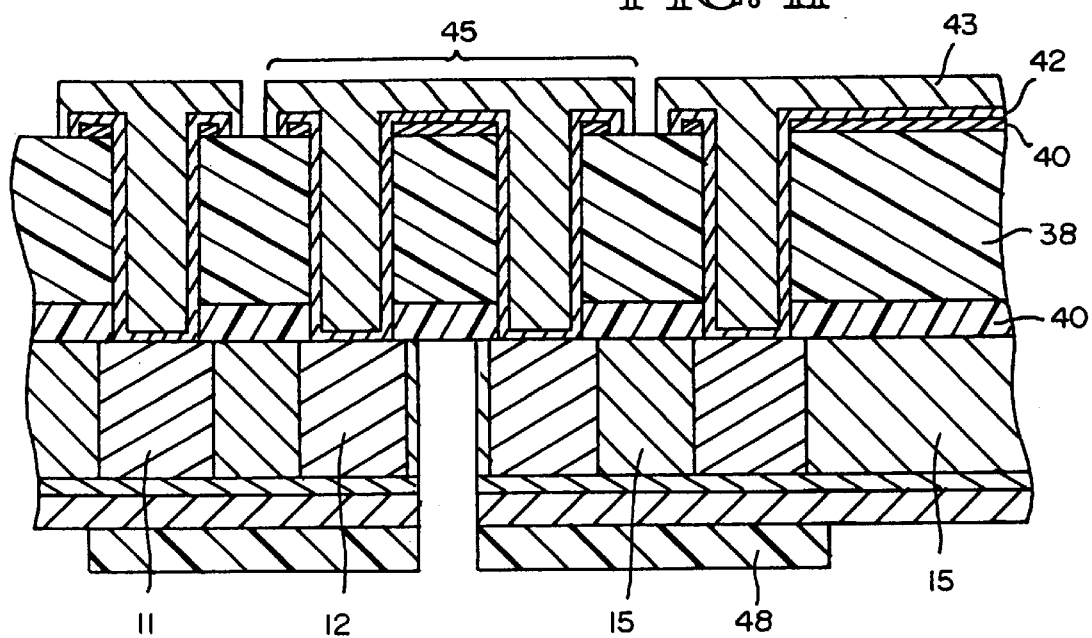

As seen in FIG. 4f, the unmasked regions of the wafer block material 15 and the plated layers 42, 43 have been subjected to a selective chemical etchant to remove portions of the wafer 32 and plated layers 42, 43 in order to create series connected thermocouples.

Figure 4G:
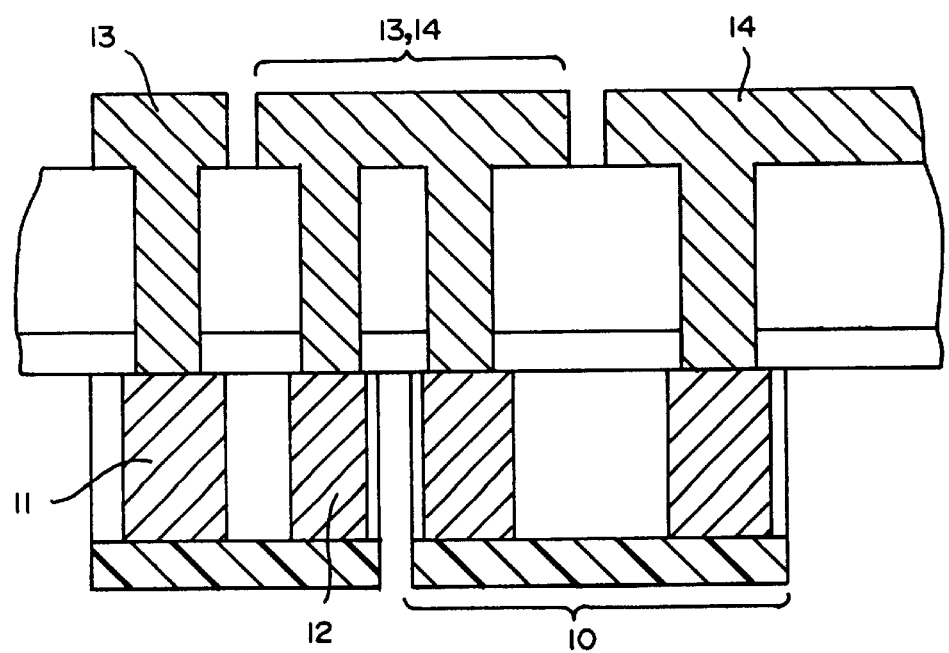

FIG. 4g displays the resultant device after chemical etching. This device now consists of heat rejecting interconnection members 13, 14, heat absorbing interconnection members 10 and the thermoelements 11 and 12 as also seen in FIG. 1.

Reference is now made to FIGS. 5a through 5i wherein an alternative method of manufacturing embodiment is shown in which heat absorbing and heat rejecting interconnection members are applied via electroplating. Again, the process flow illustrated in FIGS. 5a through 5i is a continuation of the process flow as seen in FIGS. 3a through 3f.

Figure 5A:
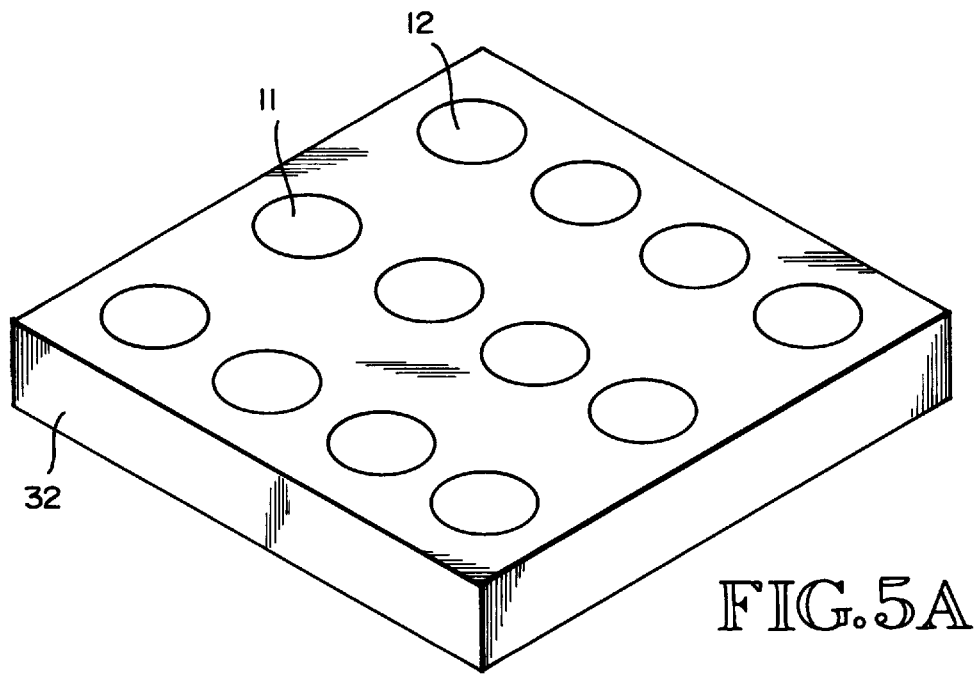

FIG. 5a depicts the wafer 32 containing thermoelements 11 and 12 originally seen in FIG. 3f.

Figure 5B:
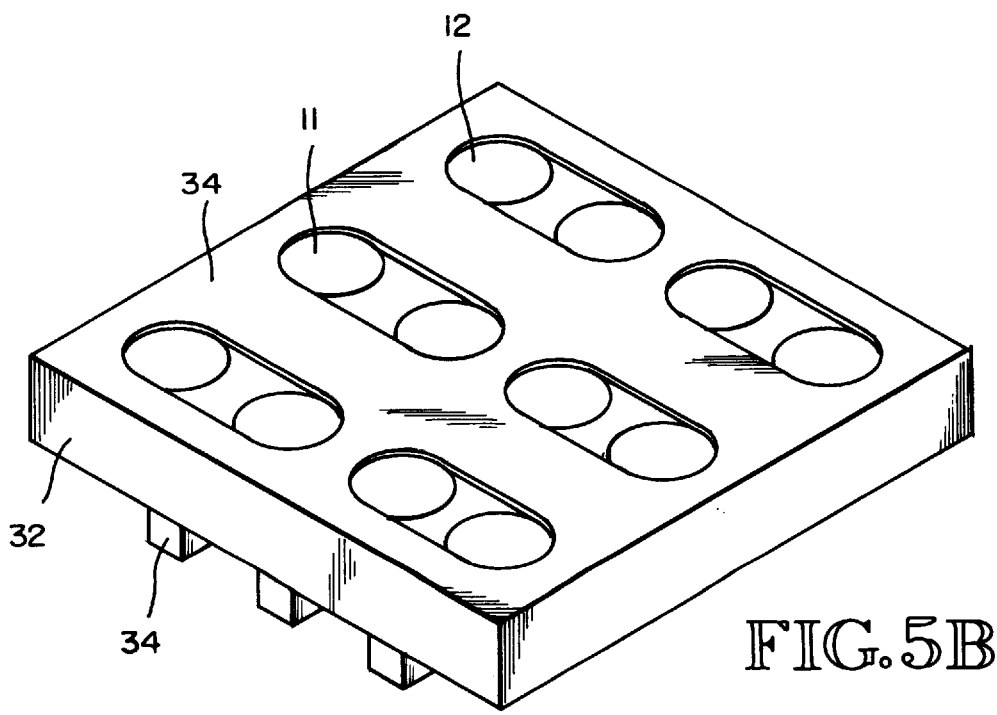

FIG. 5b contains a wafer 32 to which an electroplating mask 34 has been selectively added to both faces of the wafer 32. This mask may be applied by screen printing or as a film exposed and developed to yield the desired interconnect pattern.

Next, as seen in FIGS. 5c through 5f, the entire wafer 32, with mask 34, is subjected to electroplating to deposit multiple metallic layers in those locations on the wafer 32 which are free of mask. These metallic layers become what is known to be the heat rejecting interconnection members and the heat absorbing interconnection members which are extensions of the original wafer block 32. Additionally, these metallic layers are electroplated directly onto the exposed faces of the thermoelements as well as onto the portions of the wafer 32 located between each thermoelement 11 and 12 not containing mask 34. A molten or semi-molten metallic spraying process, such as plasma or flame spraying may also be used (in lieu of electroplating) to create the heat absorbing and heat rejecting interconnection members.

Figure 5C:
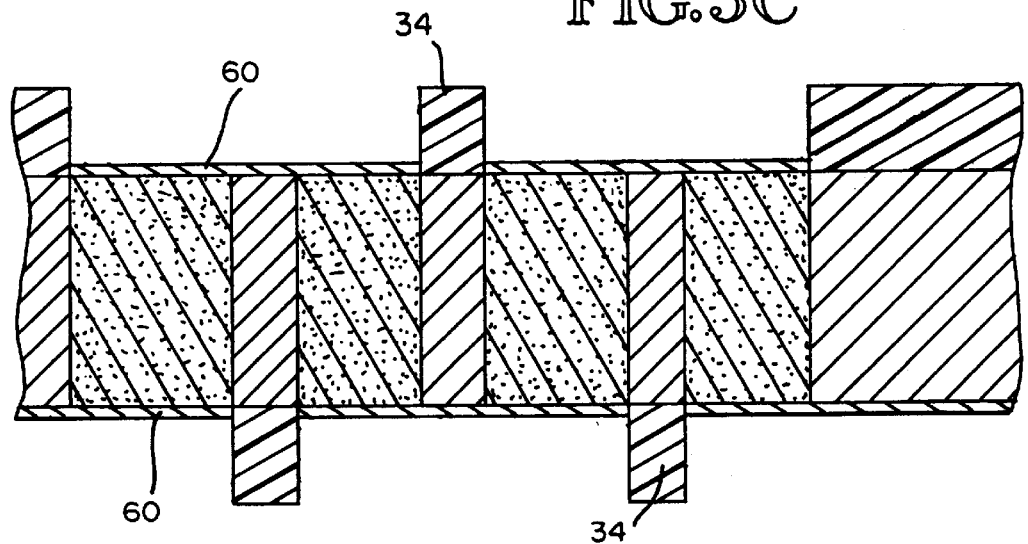

As seen in FIG. 5c, Nickel 60, a good diffusion barrier, is the metal first deposited which directly contacts each thermoelement 11 and 12 and the inter-thermoelement spaces on the wafer 32. Both faces of the wafer 32 are plated with this Nickel layer 60 to approximately 1 mil in thickness.

Figure 5D:
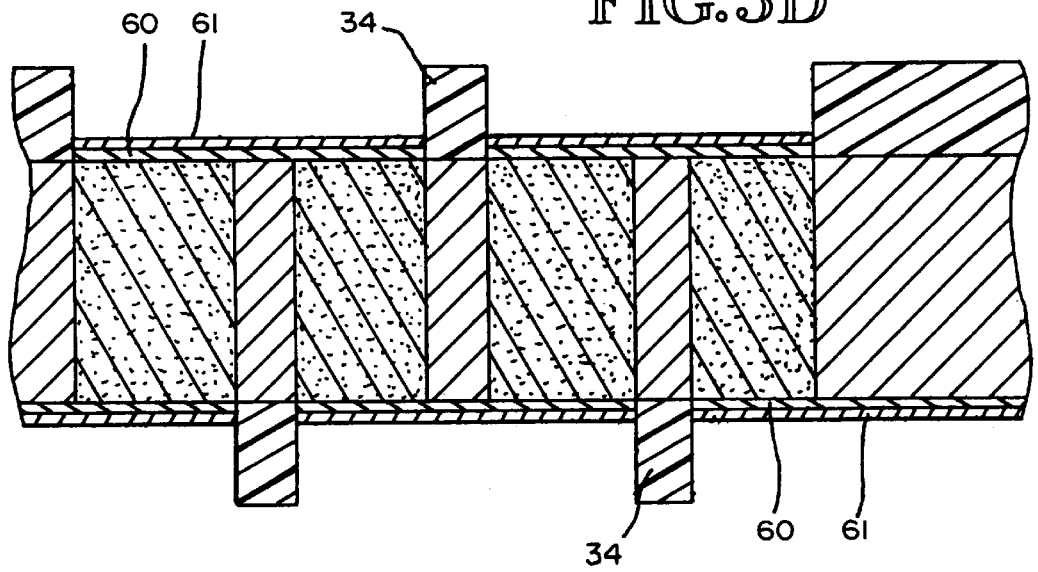
Figure 5E:
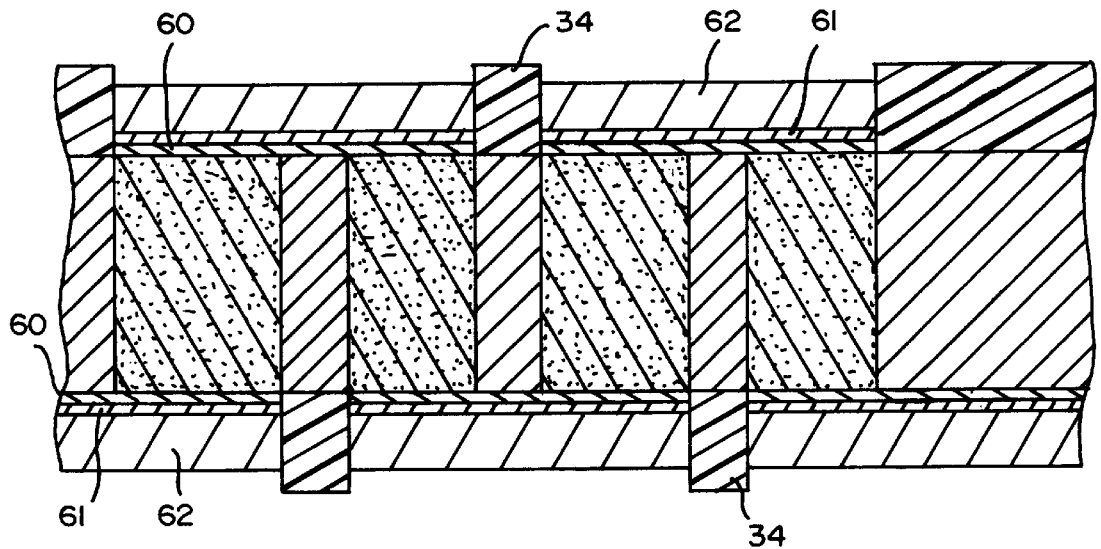
Figure 5F:
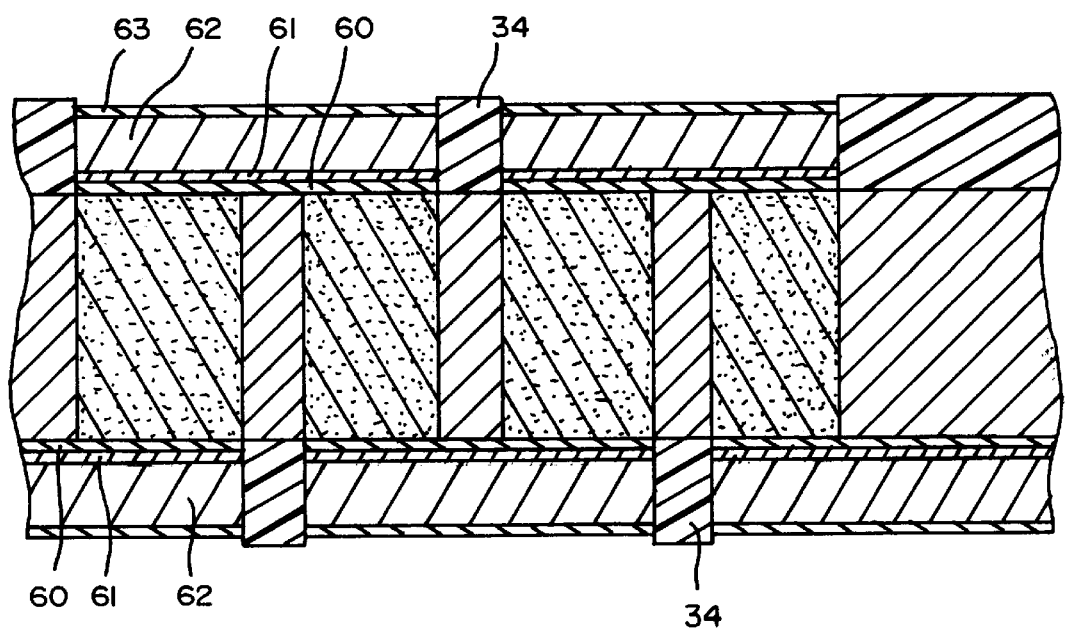
Figure 5G:
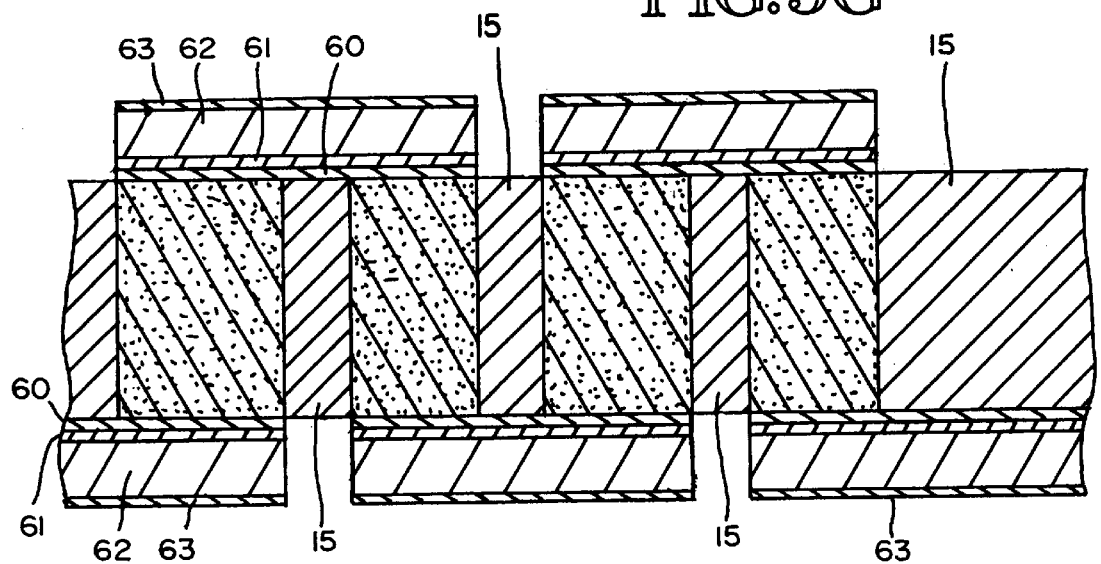

Within FIG. 5d, a 0.1 mil thick Chromium layer 61 is deposited over all previously plated Nickel 60 to act as an chemical etch resist discussed within FIG. 5g.

FIG. 5e discloses Copper metal layer 62 which is plated over the previous Chromium layer 61 for the benefit of high electrical and thermal conductivity. This layer 62 is the thickest layer at approximately 5 mils in thickness in order to reduce the overall electrical resistance of the device.

As seen in FIG. 5f, a second 0.1 mil Chromium layer 63 is deposited over all Copper 62 to also act as an etch resist seen in FIG. 5g.

FIG. 5g displays the device in which the electroplating mask has been removed, exposing the wafer block 15. The entire device will be subjected to a chemical etchant consisting of 10% Nitric Acid to selectively remove the wafer block 15 from the electroplated layers and the thermoelements 11 and 12. The plated layers will be protected by the two layers of chromium 61 and 63 due to their passivity in dilute Nitric Acid. The outer chromium layer 63 will protect the copper layer 62 beneath it as the etchant is exposed to the wafer regions 15. Once the etchant dissolves the exposed wafer regions 15, the portions of the Nickel layer 60 below the wafer regions 15 are also attacked. However, the regions of the Nickel layer 60 which are bonded to each thermoelement are undamaged. The etchant will then stop advancing when the next chromium layer 61 is reached.

Figure 5H:
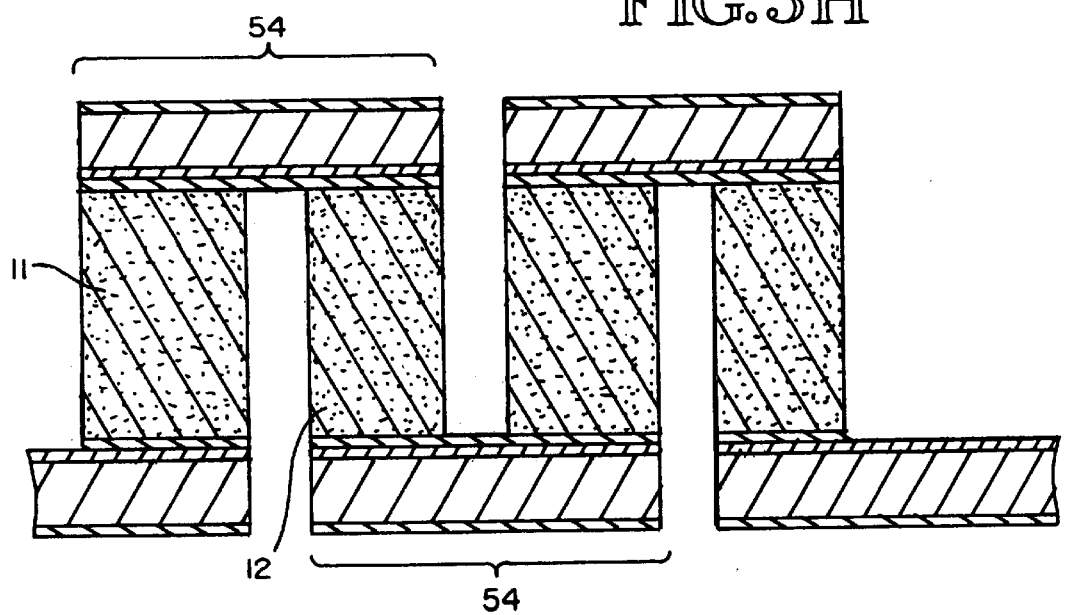
Figure 51:
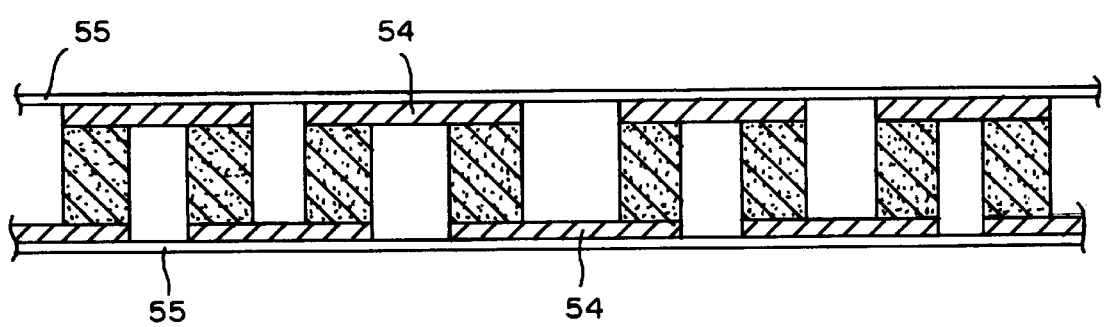

FIG. 5h displays the resultant device after chemical etching. This device now consists of interconnection members 54 and the thermoelements 11 and 12.

Lastly, FIG. 5i illustrates a method for structurally supporting the completed device through the use of a 2 to 5 mil thick flexible adhesive tape carrier 55 which is bonded (on each face of the device) to the interconnection members 54.

I claim:

1. A thermoelectric device containing at least one thermoelement wherein each thermoelement has a leg length, in centimeters, equal to the particular thermoelement's thermal conductivity value, given in watts/centimeter per degree Celsius.

2. A thermoelectric device, as in claim 1, wherein each thermoelement, whose thermal conductivity value is less than 0.01 watts/centimeters per degree Celsius, has a leg length, in centimeters, equal to the particular thermoelement's thermal conductivity value, given in watts/centimeters per degree Celsius, with a leg length tolerance of plus 0.025 centimeters.

3. A thermoelectric device, as in claim 1, wherein each thermoelement, whose thermal conductivity value is between 0.01 and less than 0.015 watts/centimeters per degree Celsius, has a leg length, in centimeters, equal to the particular thermoelement's thermal conductivity value, given in watts/centimeters per degree Celsius, with a leg length tolerance of plus 0.025 centimeters or minus 0.005 centimeters.

4. A thermoelectric device, as in claim 1, wherein each thermoelement, whose thermal conductivity value is between 0.015 and less than 0.020 watts/centimeters per degree Celsius, has a leg length, in centimeters, equal to the particular thermoelement's thermal conductivity value, given in watts/centimeters per degree Celsius, with a leg length tolerance of plus 0.025 centimeters or minus 0.005 centimeters.

5. A thermoelectric device, as in claim 1, wherein each thermoelement, whose thermal conductivity value is between 0.020 and less than 0.025 watts/centimeters per degree Celsius, has a leg length, in centimeters, equal to the particular thermoelement's thermal conductivity value, given in watts/centimeters per degree Celsius, with a leg length tolerance of plus 0.025 centimeters or minus 0.010 centimeters.

6. A thermoelectric device, as in claim 1, wherein each thermoelement, whose thermal conductivity value is between 0.025 and less than 0.050 watts/centimeters per degree Celsius, has a leg length, in centimeters, equal to the particular thermoelement's thermal conductivity value, given in watts/centimeters per degree Celsius, with a leg length tolerance of plus 0.025 centimeters or minus 0.010 centimeters.

7. A thermoelectric device as in claim 1, wherein each thermoelement, whose thermal conductivity value is equal to or greater than 0.050 watts/centimeters per degree Celsius, has a leg length, in centimeters, equal to the particular thermoelement's thermal conductivity value, given in watts/centimeters per degree Celsius, with a leg length tolerance of plus 0.025 centimeters or minus 0.010 centimeters.

8. A method of manufacturing a thermoelectric device including at least one thermoelement, one heat rejecting interconnection member one heat absorbing interconnection member, at least one hot press pin, one wafer block containing at least two cavities, each containing dissimilar thermoelectric material and providing at least one wafer having at least one wafer block cavity comprising the steps of:

a) Simultaneously dispensing thermoelectric element material to more than one wafer block cavity;

b) Simultaneously hot pressing more than one thermoelement utilizing uniaxial pressure within the wafer block;

c) Slicing completely through the wafer block (including the thermoelements), perpendicular to the cavity depth, to yield two or more wafers;

d) Forming each heat absorbing and heat rejecting interconnection member by electroplating one or more metallic layers onto the exposed faces of each thermoelement material and onto the wafer block;

e) Chemically removing all chemically non-resistant metallic materials;

f) Chemically removing part of the wafer block;

g) Mounting the completed device to an adhesive tape carrier bonded to either the heat absorbing interconnection members, heat rejecting interconnection members, or both types of interconnection members.

9. A thermoelectric device design, as in claim 8, wherein the wafer block is a steel.

10. A method of manufacture, as in claim 8, wherein step (b) utilizes a crush block interfacing all hot pressing pins, located between the pressing pins and the pressure source.

11. A method of manufacture, as in claim 8, wherein step (b) utilizes crystalline growth from a molten solution.

12. A method of manufacture, as in claim 7, wherein more than one wafer block is stacked in series with the direction of the uniaxial pressure during step (b).

13. A method of manufacture, as in claim 8, wherein step (c) involves the simultaneous slicing of more than one wafer from the wafer block.

14. A method of manufacture, as in claim 8, wherein step (c) involves the simultaneous use of two or more circular saws.

15. A method of manufacture, as in claim 8, wherein the wafer block is a dielectric.

16. A method of manufacture, as in claim 8, wherein the step (c) wafer thickness, in centimeters, is equal to the particular thermoelement's thermal conductivity value, given in watts/centimeter per degree Celsius, with a leg length tolerance of plus 0.025 centimeters or minus 0.010 centimeters.

17. A method of manufacture, as in claim 8, wherein step (d) utilizes a molten or semi-molten metallic spraying process such as plasma or flame spraying in lieu of electroplating.

18. A thermoelectric device design, as is claim 8, wherein step (d) includes at least one metallic layer, wherein a metallic layer is chromium.

19. A method of manufacturing a thermoelectric device including at least one thermoelement, one heat rejecting interconnection member, one heat absorbing interconnection member, at least one hot press pin, one wafer block containing at least two cavities, each containing dissimilar thermoelectric material, providing at least one wafer having at least one wafer block cavity and one perforated dielectric substrate comprising the steps of:

a) Simultaneously dispensing thermoelectric material to more than one wafer block cavity;

b) Simultaneously hot pressing more than one thermoelement utilizing uniaxial pressure within the wafer block cavities;

c) Slicing completely through the wafer block, including the thermoelements, perpendicular to the cavity depth to yield two or more wafers;

d) Mounting a perforated dielectric substrate to one face of each wafer;

e) Forming each heat absorbing and heat rejecting interconnection member by electroplating one or more metallic layers onto the exposed faces of each thermoelement material and onto the wafer block;

f) Electroplating a metallic layer(s) into the substrate perforations to create heat rejecting interconnection members bonded directly to each heat rejecting face of the thermoelements;

g) Chemically removing all chemically non-resistant metallic materials;

h) Chemically removing part of the wafer block;

i) Mounting the completed device to a adhesive tape carrier bonded to either the heat absorbing interconnection members, heat rejecting interconnection members, or both types of interconnection members.

20. A thermoelectric device design, as in claim 19, wherein the wafer block is a steel.

21. A method of manufacture, as in claim 19, wherein more than one wafer block is stacked in series with the direction of the uniaxial pressure during step (b).

22. A method of manufacture, as in claim 19, wherein step (b) utilizes crystalline growth from a molten solution.

23. A method of manufacture, as in claim 19, wherein step (b) utilizes a crush block interfacing all hot pressing pins, located between the pressing pins and the pressure source.

24. A method of manufacture, as in claim 19, wherein the step (c) wafer thickness, in centimeters, is equal to the particular thermoelement's thermal conductivity value, given in watts/centimeter per degree Celsius, with a leg length tolerance of plus 0.025 centimeters or minus 0.010 centimeters.

25. A method of manufacture, as in claim 19, wherein step (c) involves the simultaneous slicing of more than one wafer from the wafer block.

26. A method of manufacture, as in claim 19, wherein step (c) involves the simultaneous use of two or more circular saws.

27. A thermoelectric device design, as is claim 19, wherein step (d) includes at least one metallic layer, wherein a metallic layer is chromium.

28. A method of manufacture, as in claim 19, wherein step (e) utilizes a molten or semi-molten metallic spraying process such as plasma or flame spraying in lieu of electroplating.

29. A method of manufacture, as in claim 19, wherein the wafer block is a dielectric.

* * * * *